(12) United States Patent
George et al.

(10) Patent No.: US 10,026,312 B1
(45) Date of Patent: Jul. 17, 2018

(54) PEDESTRIAN PUSHBUTTON

(71) Applicant: Pelco Products, Inc., Edmond, OK (US)

(72) Inventors: Kennith E. George, Edmond, OK (US); Kevin A. Kerr, Yukon, OK (US)

(73) Assignee: Pelco Products, Inc., Edmond, OK (US)

( * ) Notice: Subject to any disclaimer, the term of this patent is extended or adjusted under 35 U.S.C. 154(b) by 0 days.

(21) Appl. No.: 14/997,904

(22) Filed: Jan. 18, 2016

Related U.S. Application Data

(63) Continuation-in-part of application No. 13/827,016, filed on Mar. 14, 2013, now abandoned.

(60) Provisional application No. 61/614,296, filed on Mar. 22, 2012.

(51) Int. Cl.
| | |
|---|---|
| *H01L 41/113* | (2006.01) |
| *H01H 57/00* | (2006.01) |
| *G08G 1/07* | (2006.01) |
| *H03K 17/96* | (2006.01) |
| *G08G 1/005* | (2006.01) |

(52) U.S. Cl.
CPC .............. *G08G 1/07* (2013.01); *G08G 1/005* (2013.01); *H01H 57/00* (2013.01); *H01L 41/1132* (2013.01); *H03K 17/964* (2013.01)

(58) Field of Classification Search
CPC ........................ H01H 57/00; H01H 2057/006; H01L 41/113; H01L 41/1132; H01L 41/04
USPC .......................................... 310/338; 200/181
See application file for complete search history.

(56) References Cited

U.S. PATENT DOCUMENTS

| | | |
|---|---|---|
| 3,586,280 A | 6/1971 | Parduhn |
| 3,764,099 A | 10/1973 | Parduhn |
| 3,854,685 A | 12/1974 | Parduhn |
| 4,032,248 A | 6/1977 | Parduhn et al. |
| D246,585 S | 12/1977 | Parduhn |
| D249,517 S | 9/1978 | Parduhn |
| 4,135,192 A | 1/1979 | Parduhn |
| 4,187,418 A | 2/1980 | Harris |
| 4,293,841 A | 10/1981 | Potter |
| D276,213 S | 11/1984 | Parduhn |
| 4,618,797 A | 10/1986 | Cline |
| D286,667 S | 11/1986 | Parduhn |
| 4,659,046 A | 4/1987 | Parduhn |
| 4,691,884 A | 9/1987 | Parduhn |
| D328,243 S | 7/1992 | Parduhn |
| D329,589 S | 9/1992 | Parduhn |

(Continued)

*Primary Examiner* — Derek Rosenau
(74) *Attorney, Agent, or Firm* — Mary M. Lee

(57) ABSTRACT

A pedestrian pushbutton for activating a traffic device. A plunger mounted in a housing impinges on a piezo element when pressed. O-rings between the bolts that secure the plunger to the housing and the housing bias the plunger inwardly. A foam disk under the piezo element, or a resilient stem bumper on the back of the plunger, or both, bias the plunger outwardly with a force about equal to the inwardly biasing force of the O-rings on the bolts. Thus, the opposing resilient members maintain the plunger at neutral buoyancy when at rest. An O-ring disposed between the edge of the plunger and the opening in the housing centers the plunger. The pushbutton may include light and sound assemblies to confirm to the pedestrian visually and audibly that the pushbutton has been engaged. The sound chamber may be tuned based on the Helmholtz formula to achieve an optimum frequency.

23 Claims, 10 Drawing Sheets

(56) References Cited

U.S. PATENT DOCUMENTS

| | | |
|---|---|---|
| D335,279 S | 5/1993 | Parduhn |
| 5,216,316 A | 6/1993 | Ipcinski |
| 5,299,111 A | 3/1994 | Parduhn et al. |
| 5,332,944 A | 7/1994 | Cline |
| 5,357,566 A | 10/1994 | Dowling, Jr. et al. |
| 5,477,942 A | 12/1995 | Shea et al. |
| D370,825 S | 6/1996 | Parduhn |
| D373,947 S | 9/1996 | Parduhn |
| 5,587,567 A | 12/1996 | Winter et al. |
| D379,756 S | 6/1997 | Parduhn |
| 5,636,729 A | 6/1997 | Wiciel |
| 5,645,255 A | 7/1997 | Parduhn |
| 5,767,465 A | 6/1998 | Fulton et al. |
| 5,920,050 A | 7/1999 | Tolman |
| 5,935,478 A | 8/1999 | Parduhn |
| 6,064,141 A | 5/2000 | Wiciel |
| 6,195,021 B1 | 2/2001 | Keaveney |
| 6,204,446 B1 | 3/2001 | Parduhn |
| 6,340,936 B1 | 1/2002 | McGaffey et al. |
| 6,357,709 B1 | 3/2002 | Parduhn |
| 6,466,140 B1 | 10/2002 | McGaffey et al. |
| 6,980,126 B2 | 12/2005 | Fournier |
| 6,982,630 B2 | 1/2006 | Beckwith et al. |
| 7,145,476 B2 | 12/2006 | Beckwith et al. |
| 7,253,720 B2 | 8/2007 | Beckwith et al. |
| 7,258,314 B1 | 8/2007 | Parduhn et al. |
| 7,523,912 B1 | 4/2009 | Woods |
| 7,601,928 B1 | 10/2009 | Magness et al. |
| 7,997,546 B1 | 8/2011 | Anderson et al. |
| 8,173,904 B1 | 5/2012 | Parduhn et al. |
| 8,474,780 B2 | 7/2013 | Parduhn et al. |
| 8,665,115 B2 | 3/2014 | Gubbe et al. |
| 8,875,451 B1 | 11/2014 | Parduhn et al. |
| 9,200,654 B1 | 12/2015 | Parduhn |
| 2006/0139153 A1* | 6/2006 | Adelman .................. G10K 9/00 340/388.4 |
| 2011/0095162 A1 | 4/2011 | Parduhn et al. |
| 2013/0173064 A1* | 7/2013 | Fadell ................ G05D 23/1902 700/276 |

\* cited by examiner

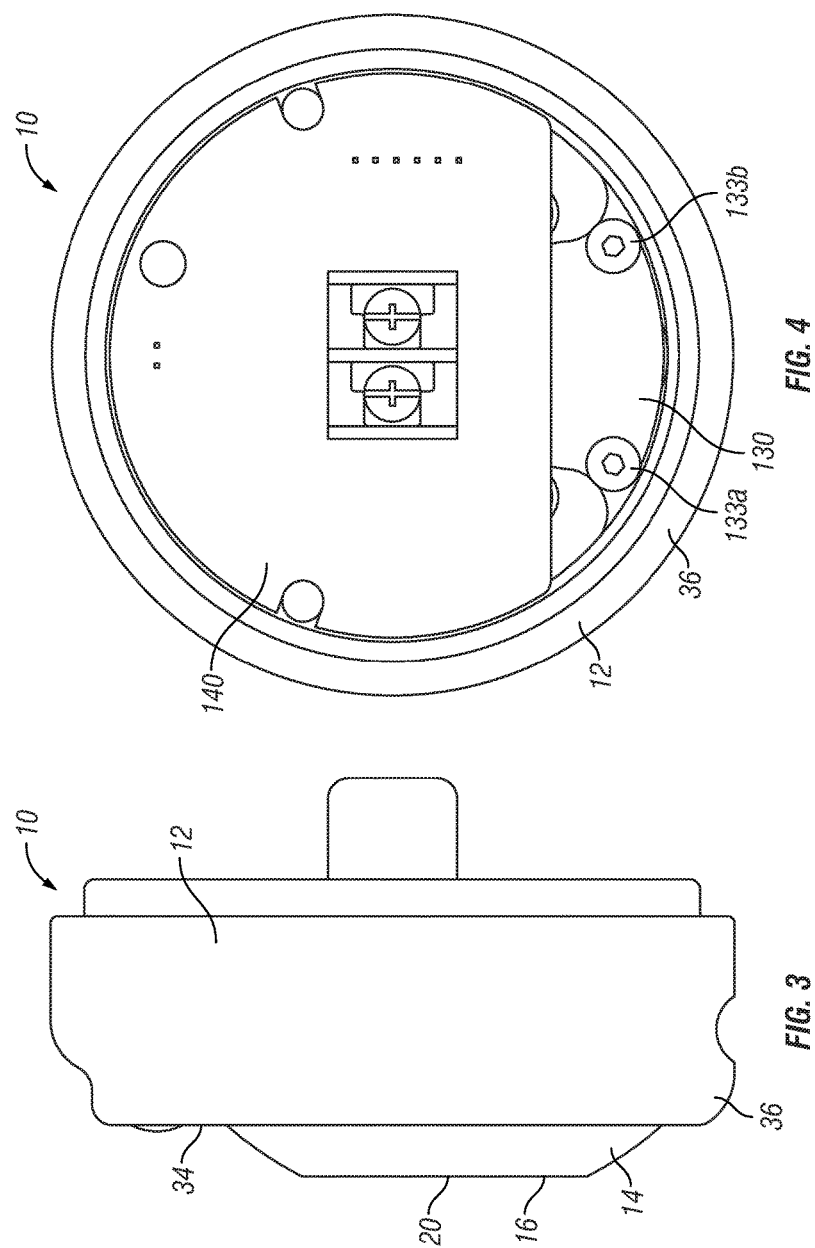

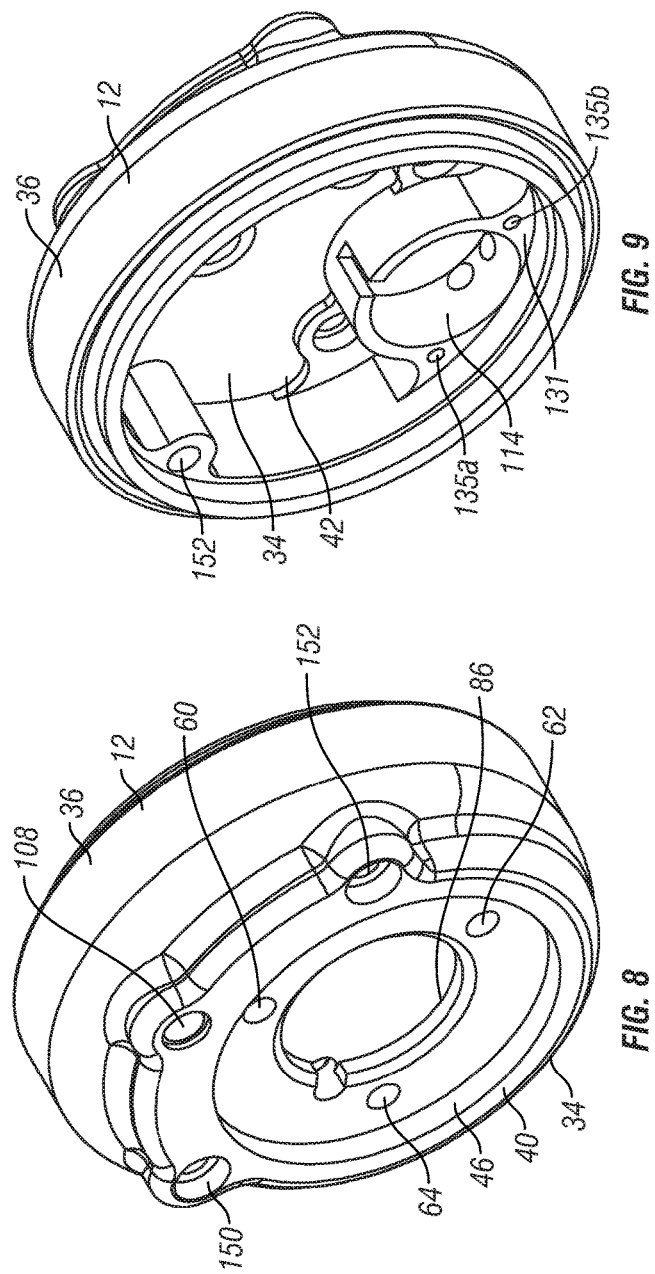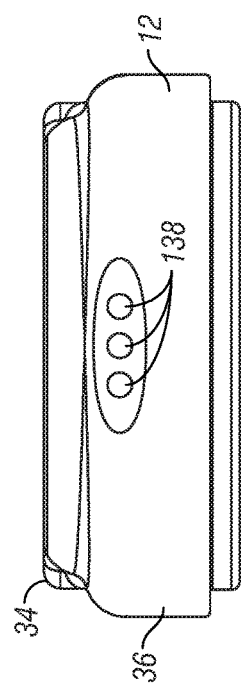

PEDESTRIAN PUSHBUTTON

CROSS-REFERENCE TO RELATED APPLICATIONS

This application is a continuation-in-part of co-pending application Ser. No. 13/827,016, entitled "Pedestrian Pushbutton with Piezo-Electric Element," filed Mar. 14, 2013, which claims the benefit of U.S. provisional application No. 61/614,296 entitled "Pedestrian Pushbutton with Piezo-Electric Element," filed Mar. 22, 2012, and the contents of these applications are incorporated herein by reference.

FIELD OF THE INVENTION

The present invention relates generally to traffic control devices, and more particularly but without limitation, to pedestrian pushbuttons for controlling such devices.

BRIEF DESCRIPTION OF THE DRAWINGS

The accompanying drawings, which are incorporated into and form a part of the specification, illustrate one or more embodiments of the present invention and, together with this description, serve to explain the principles of the invention. The drawings merely illustrate preferred embodiments of the invention and are not to be construed as limiting the scope of the invention.

FIG. 3 is a side elevational view of the pushbutton assembly of FIG. 1.

FIG. 4 is a rear elevational view of the pushbutton assembly of FIG. 1.

FIG. 8 is a right front perspective view of the housing.

FIG. 9 is a left rear perspective view of the housing.

FIG. 10 is a bottom elevational view of the housing showing the sound holes.

DETAILED DESCRIPTION OF THE PREFERRED EMBODIMENT(S)

Traffic control devices in areas that accommodate pedestrian traffic often are equipped with pushbuttons to actuate the device manually. The present invention is directed to such pushbutton assemblies. In the present invention, the plunger of the pushbutton assembly impinges on a piezo-electric element that, in turn, initiates the activation of the traffic control device. In the preferred embodiment the pushbutton assembly includes both a light assembly and a sound assembly for confirming to the pedestrian that the pushbutton has been engaged successfully.

Figure 2:
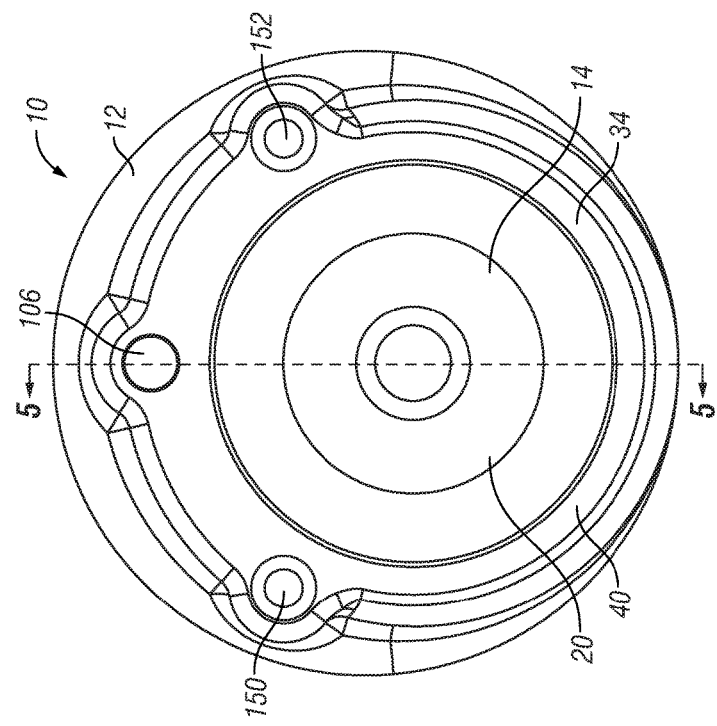
FIG. 2 is a front elevational view of the pushbutton assembly of FIG. 1.
Figure 1:
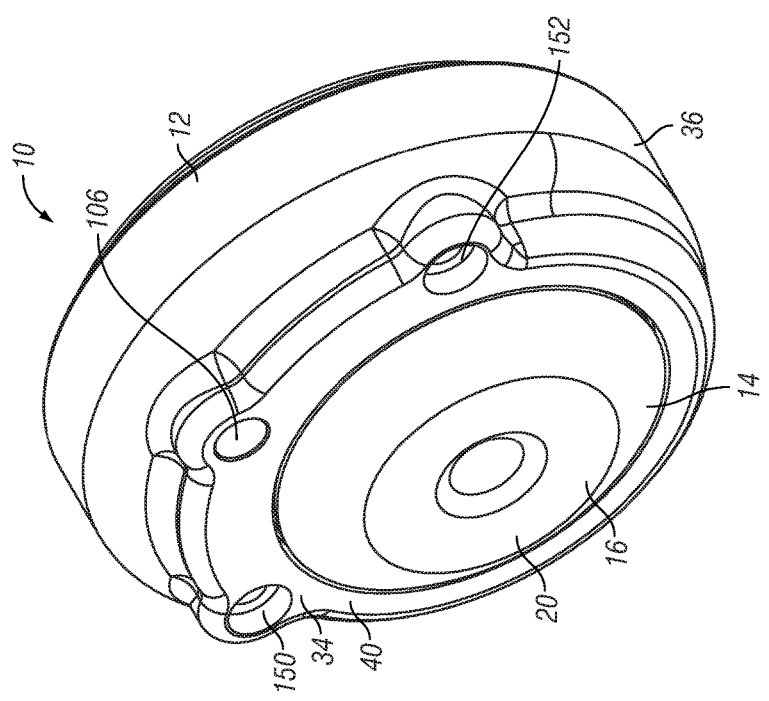
FIG. 1 is a right front perspective view of a pedestrian pushbutton assembly made in accordance with a preferred embodiment of the present invention.

Turning now to the drawings in general and to FIGS. 1-7 in particular there is shown therein a pushbutton assembly constructed in accordance with a preferred embodiment of the present invention and designated generally by the reference number 10. As seen in FIGS. 1-3, the pushbutton assembly comprises a housing 12 and a plunger 14 that is mounted in the housing for axial movement to activate the traffic device.

Figure 5:
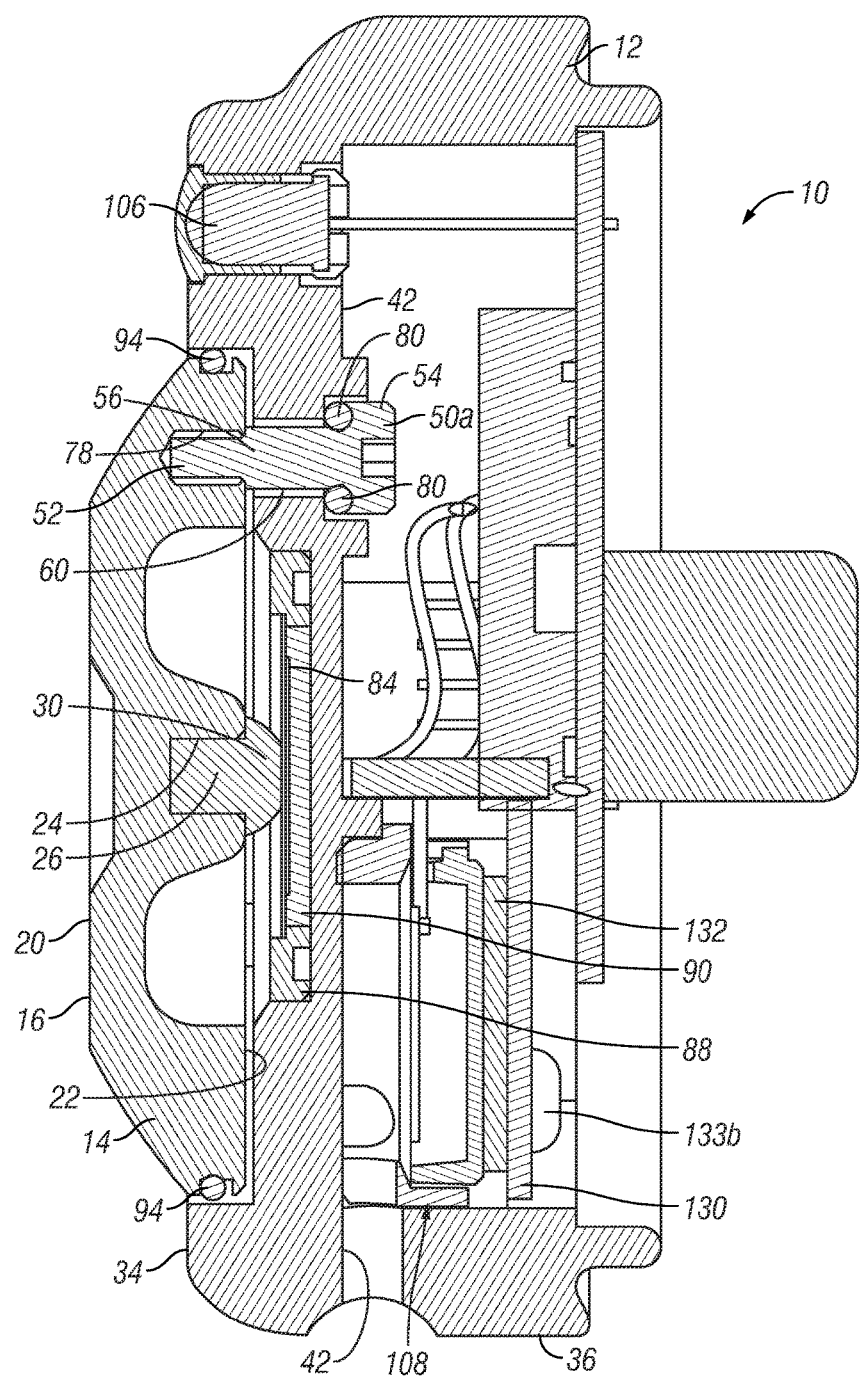
FIG. 5 is a longitudinal sectional view taken along the line 5-5 in FIG. 2.
Figure 7:
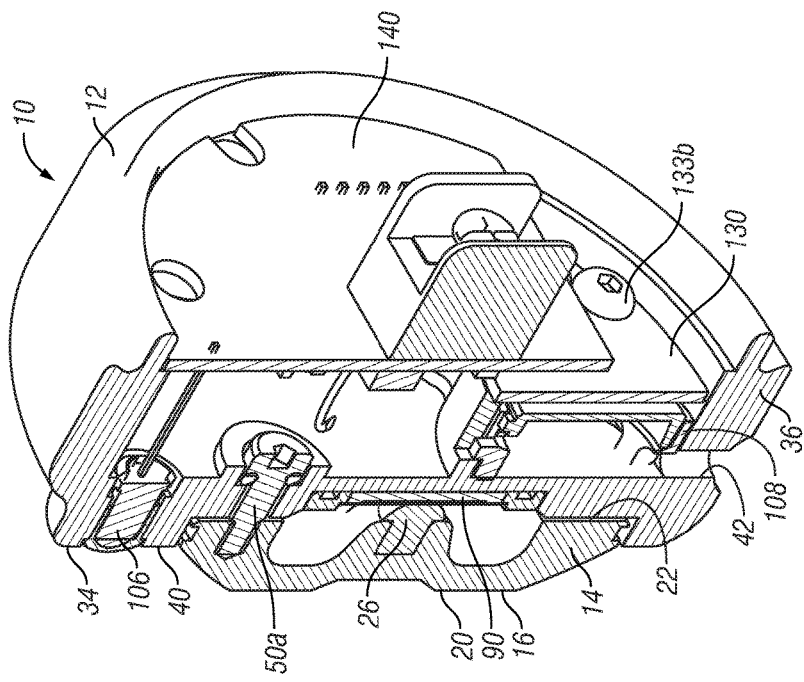
FIG. 7 is a right rear perspective view of the left half of the pushbutton assembly of FIG. 1.
Figure 6:
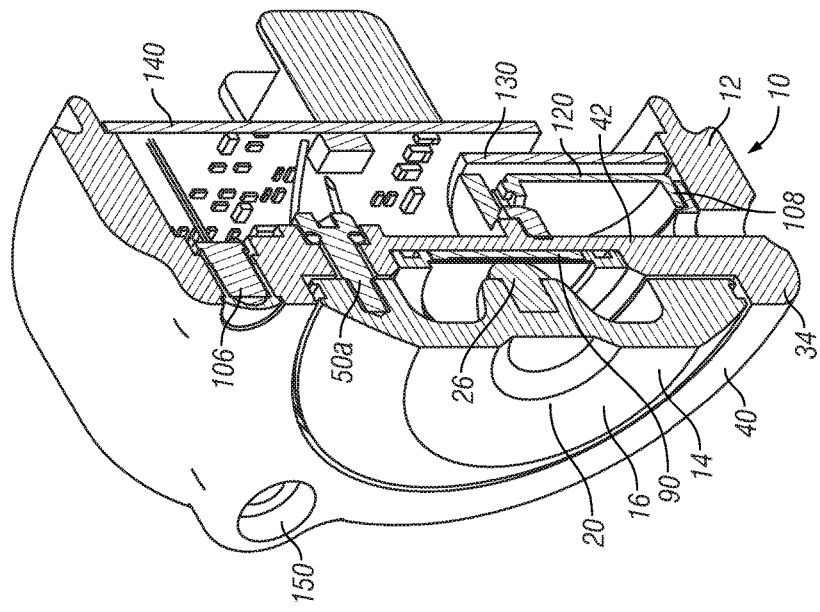
FIG. 6 is a right front perspective view of the left half of the pushbutton assembly of FIG. 1.
Figure 14:
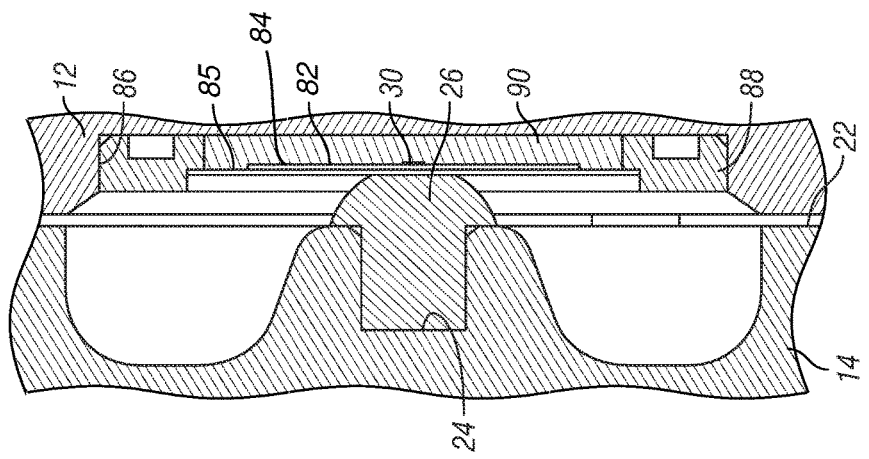
FIG. 14 is an enlarged detail view of the piezo switch and the stem bumper on the plunger that impinges on it.

The front 16 of the plunger 14 defines a pushbutton 20 that is pressed by the pedestrian. As best seen in FIG. 5, the plunger 14 has a back 22 that includes a recess 24 that supports a stem bumper 26. (See also FIG. 14.) The stem bumper 26 is formed of rubber or other resilient material and the innermost end defines a nose 30.

As shown in more detail in FIGS. 8-12, the housing 12 may be generally cup-shaped having a front wall 34 and a rearwardly extending side wall 36. The front wall 34 has a front surface 40 and a rear surface 42. The front surface 40 of the front wall 34 defines a plunger recess 46 (FIG. 12) configured to receive the plunger 14.

The plunger 14 is mounted for axial movement in the plunger recess 46 between a neutral or resting position and an engaged position. To that end, the pushbutton assembly 10 comprises at least one bolt for movably securing the plunger 14 to the housing 12. More preferably, a plurality of such bolts is used to mount the plunger 14. In the embodiment shown, three such bolts 50a, 50b, and 50c (FIG. 16B) are used. As the bolts are similarly formed, only the bolt 50a will be described.

Figure 12:
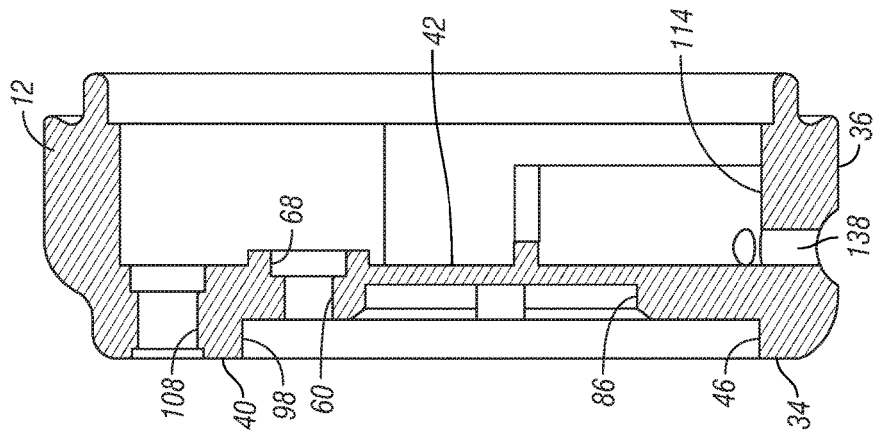
FIG. 12 is a sectional view of the housing taken along line 12-12 of FIG. 11.
Figure 11:
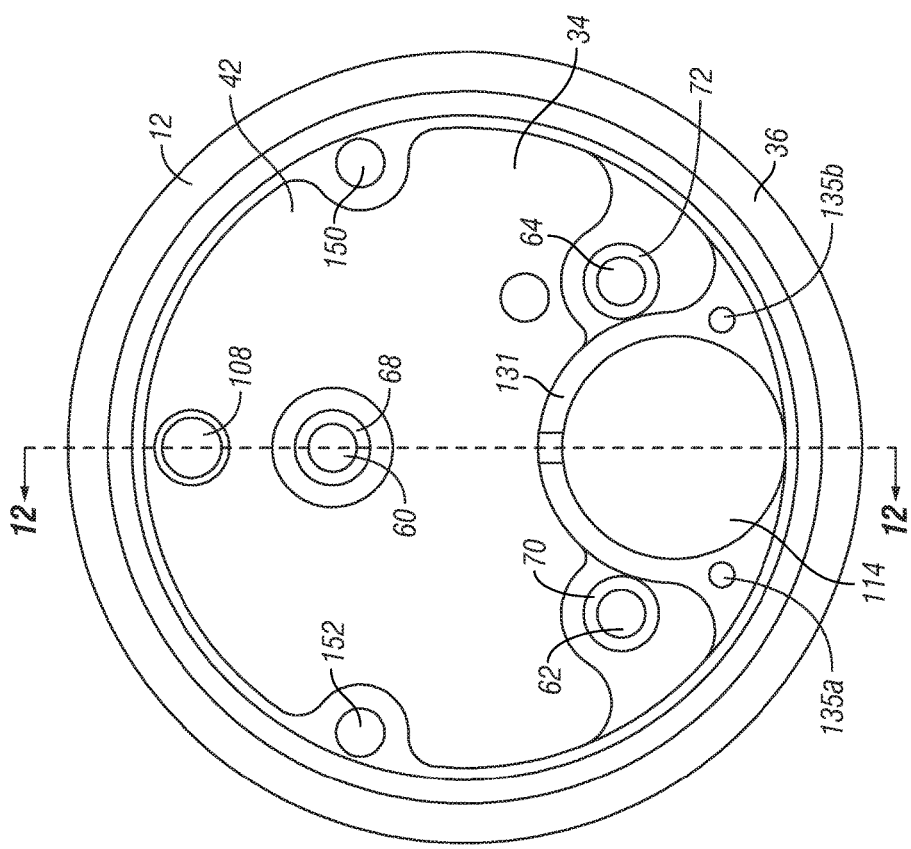
FIG. 11 is a rear elevational view of the housing.
Figure 13:
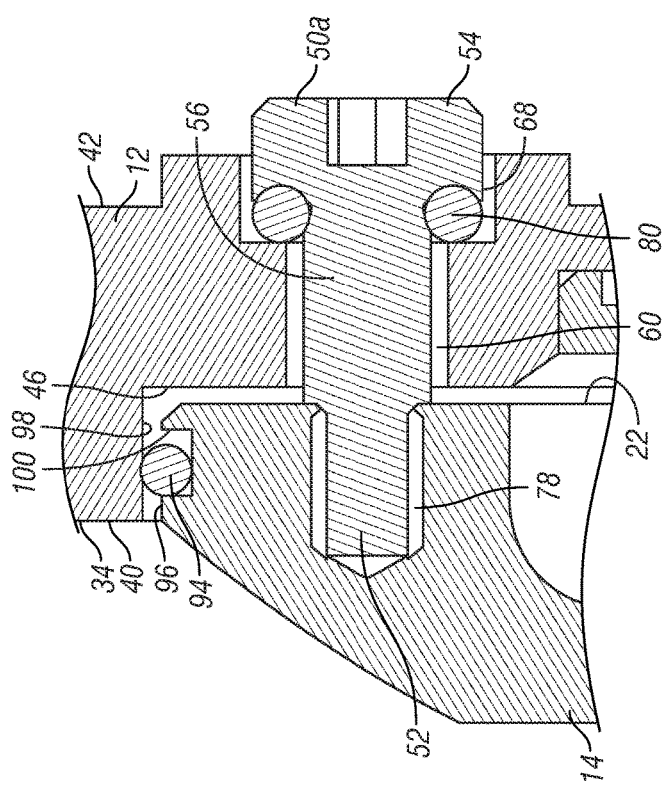
FIG. 13 is an enlarged detail view of one of the bolts used to attach the plunger to the housing showing the O-ring under the head of the bolt.

As best seen in FIG. 13, the bolt 50a has a free end 52 that is threaded (threads not shown), a bolt head 54, and an unthreaded shaft 56 extending between the free end and the head. The plunger recess 46 of the housing 12 has three circumferentially arranged unthreaded bolt holes 60, 62, and 64 (FIGS. 8 & 11), each with a recessed annular shoulder 68 (FIG. 12), 70, and 72, formed in the rear surface 42 for partially receiving the bolt heads.

Referring still to FIG. 13, the bolt hole 60 and the bolt shaft 56 are sized to allow non-frictional movement of the bolt as the plunger 14 reciprocates. The back 22 of the plunger 14 has a threaded bore 78 for threadedly receiving the free end 52 of the bolt 50a so that the plunger is fixed to the bolt. Disposed around the shaft 56 between the bolt head 54 and the shoulder 68 on the rear surface 42 of the front wall 34 of the housing 12 is a first resilient member, which may be an O-ring 80, for a purpose to be described below.

As indicated above, the plunger 14 is used to activate the traffic control device. To that end, the pushbutton assembly 10 comprises a switch configured to be actuated by inward pressure on the pushbutton 20. Preferably, the switch comprises a piezo bender 84. The piezo bender 84 typically includes a piezo-electric element 82 (FIGS. 14 & 16B) mounted to a larger circular plate 85. The piezo bender 84 may be positioned in a piezo recess 86 formed in the center of the plunger recess 46, as best seen in FIGS. 8, 12, and 16B. The piezo bender 84 may be mounted circumferentially inside an annular isolator ring 88 received inside the piezo recess 86. Centered under the piezo bender 84 inside the isolator 88 is a resilient member, such as the foam pad 90.

The piezo bender 84 is positioned to confront the nose 30 on the end of the stem bumper 26 on the back of the plunger 14 so that pressure on the pushbutton 20 will actuate the piezo bender. Thus, the piezo bender 84 is suspended between the resilient stem bumper 26 in front and the resilient foam pad 90 in back.

In the assembled pushbutton 10, the stem bumper 26, the piezo bender 84, and the foam pad 90 are configured to be held in close abutting relationship. In this way, when the pushbutton 20 is pressed, the stem bumper 26 impinges on the piezo bender 84. The foam pad 90 provides resilient support to the piezo bender 84 yielding slightly in response to pressure (force) on the pushbutton 20 and otherwise exerts slight but constant outward pressure on the plunger 14. Consequently, when the pressure is released, the stem bumper 26 and the foam pad 90 return to their resting shapes. In other words, the stem bumper 26 and the foam pad 90, or both, form a second resilient member that exerts a slight force on the plunger 14 biasing it outwardly.

In the assembled pushbutton, the bolts 50a, 50b, and 50c holding the plunger 14 in the plunger recess 46 are tightened to apply slight compression on the O-rings 80 (FIG. 13). This creates a slight biasing force on the plunger 14 inwardly (towards the inside of the housing) that is opposite to the force generated by the foam pad 90 and the stem bumper 26. Ideally, the outwardly biasing force exerted on the plunger 14 by the stem bumper 26 and the foam pad 90 (the second resilient member) is about equal to the inwardly biasing force exerted on the plunger by the O-rings 80 on the bolts 50 (the first resilient member) as this will maintain the plunger at neutral buoyancy when at rest. The overall resistance to compression of the pushbutton 20 should be less than the maximum pressure determined by the relevant governing authorities.

With continuing reference to FIG. 13, in the preferred embodiment, the pushbutton assembly 10 includes a structure for centering the plunger 14 within the plunger recess 46. For this purpose, an annular resilient member, such as the O-ring 94, may be disposed between the peripheral rim 96 of the plunger 14 and the peripheral wall 98 (FIG. 12) of the plunger recess 46. A circumferential groove 100 (FIG. 13) may be formed in either the peripheral rim 96 of the plunger 14 or the peripheral wall 98 of the plunger recess 46 to receive the O-ring 94.

In the preferred embodiment, the pushbutton assembly 10 comprises a light assembly, such as an LED bulb 106 (FIG. 5) configured to emit a light in response to pressure on the pushbutton. This will provide confirmation to the pedestrian that the pushbutton 20 has been successfully engaged. The LED light 106 may be mounted in the front wall 34 of the housing 12 in a bore 108 (FIG. 12). The light provides visual confirmation to a user who may be deaf or hearing-impaired.

It is also sometimes desirable to include a sound assembly 108 configured to emit sound in response to actuation of the piezo switch 84. This will provide another means of confirming to the pedestrian, particularly, visually-impaired individuals, that the pushbutton 20 has been actuated. A most preferred sound assembly comprises a piezo sounder 110.

Figure 15:
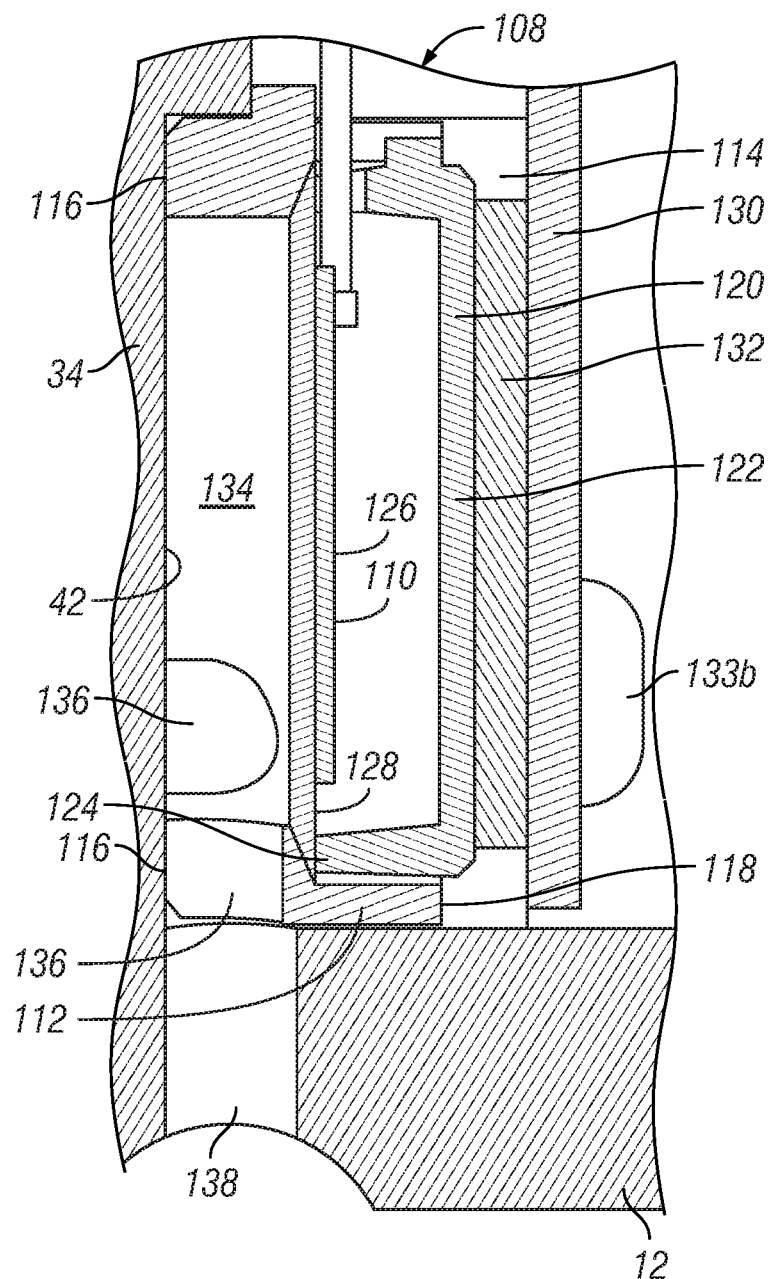
FIG. 15 is an enlarged detail view of the sound assembly.
Figure 16A:
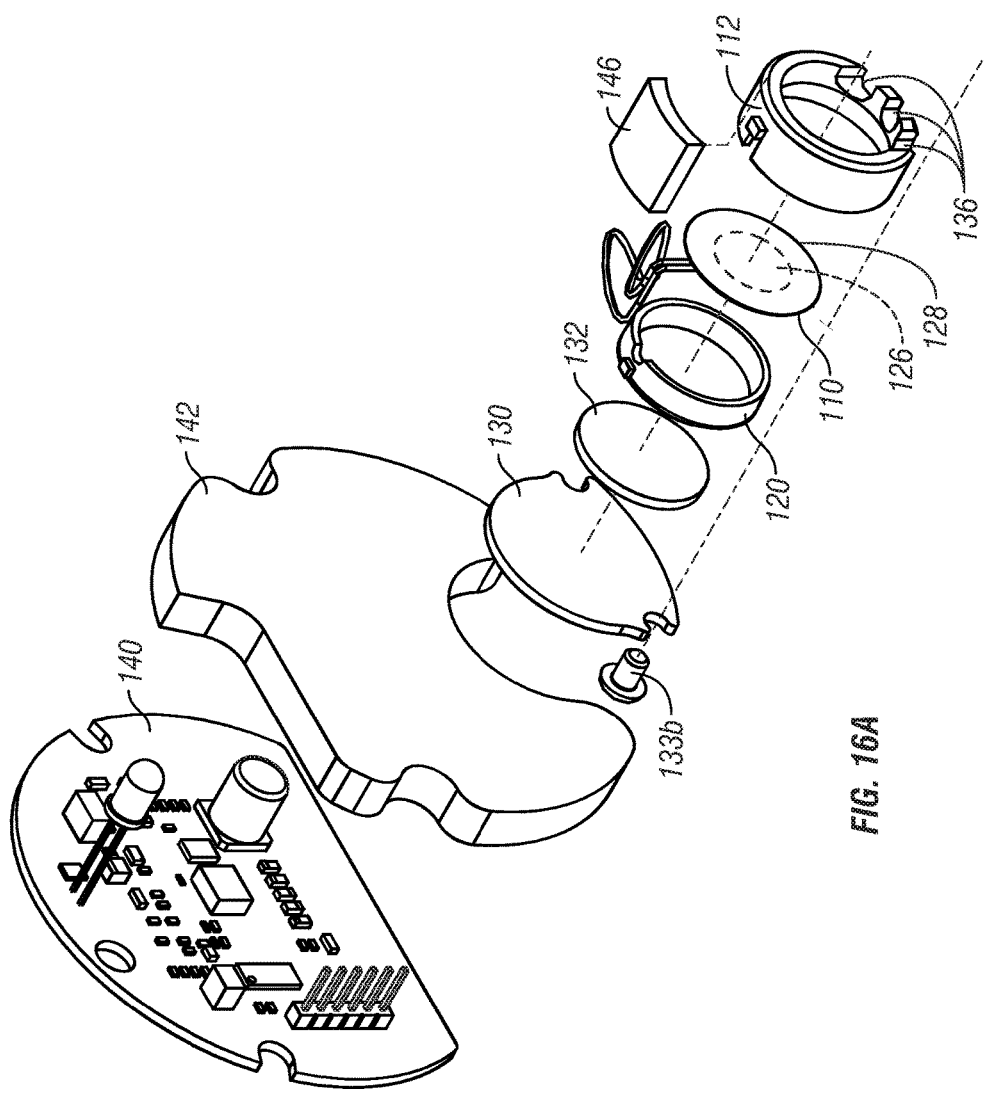
FIGS. 16A and 16B are sequential exploded views of the pushbutton assembly of FIG. 1.
Figure 16B:
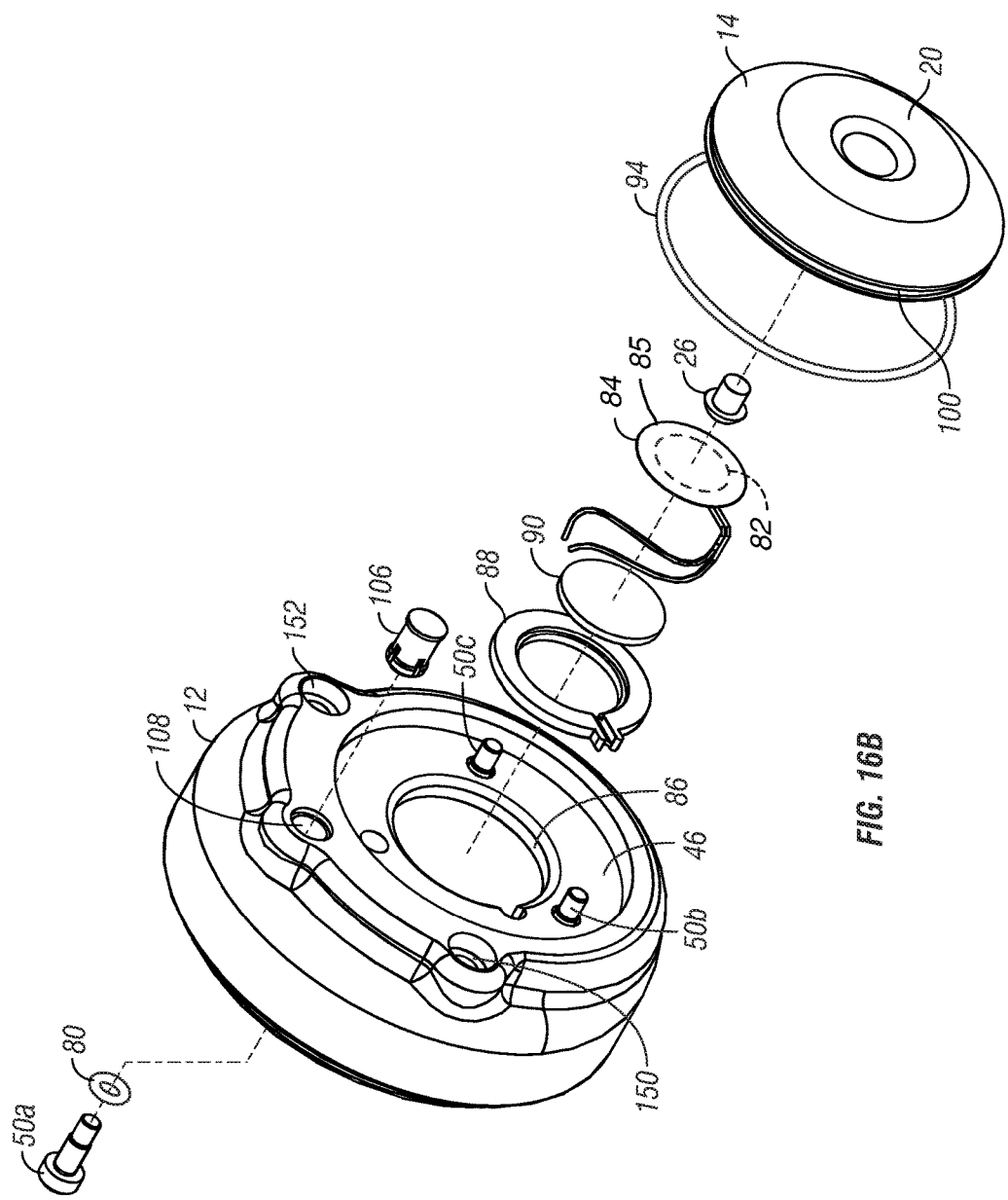

As seen in FIGS. 15 and 16A, the sound assembly 110 may comprise a sound housing 112 that is sized to fit within the sound housing recess 114 (FIGS. 9&12) formed on the rear surface 42 of the front wall 34 of the housing 12. The sound housing 112 has one end 116 that abuts the rear surface 42 of the front wall 34 and an opposite open end 118. A cup-shaped cover 120 with a closed end 122 and opposite open end 124. The open end 124 of the cover 120 fits inside the open end 118 of the sound housing 112 so that their respective side walls overlap slightly.

The piezo sounder 110 typically includes a piezo-electric element 126 (FIGS. 15 & 16A) mounted to a larger circular plate 128. The peripheral edge of the circular plate 128 of the piezo sounder 110 is circumferentially captured between the open end 118 of the sound housing 112 and the open end 124 of the cup-shaped cover 120. The sound housing recess 114 is enclosed with a closure plate 130. A resilient support, such as the foam pad 132, may be positioned between the closed end 122 of the cover 120 and the inside surface of the closure plate 130.

The closure plate 130 is attached to the rear facing edge 131 (FIGS. 9&11) of the sounding housing recess 114 by screws 133a and 133b (FIG. 4). The edge 131 is provided with holes 135a and 135b to receive the screws 133a and 133b. Thus, as illustrated best in FIGS. 5 and 15, there is no direct attachment between cup-shaped cover 120 and the sound housing 112.

The space between the front wall 34 of the housing 12 and the piezo sounder 110 inside the sound housing 112 forms a resonance chamber 134. Openings 136 in the sidewall of the sound housing 112 and aligned openings 138 (FIG. 10) in the sidewall 36 of the housing 12 allow the sound waves to exit the chamber 134. As there are no specific points of attachment on the edge of the piezo plate 128, the plate deforms uniformly.

An optimum frequency of the sound produced by the sound assembly 108 may be achieved by manipulating the diameter and length of the resonance chamber 134 according to the Helmholtz formula. In the preferred embodiment, that sound level is greater than about 100 dB, but this may vary depending on the location and application of the pushbutton.

As seen in FIG. 16A, a circuit board 140 is mounted at the back of the housing. A foam insert 142 (shown only in FIG. 16A) may be included to reduce the amount of potting required. Butyl tape 146 may be used to seal the sound housing 112 as the potting is inserted.

Bolts (not shown) may be included to attach the assembled pushbutton assembly 10 to a suitable support surface. The housing 12 includes a pair of bolt holes 150 and 152 for that purpose.

The embodiments shown and described above are exemplary. Many details are often found in the art and, therefore, many such details are neither shown nor described herein. It is not claimed that all of the details, parts, elements, or steps described and shown were invented herein. Even though numerous characteristics and advantages of the present inventions have been described in the drawings and accompanying text, the description is illustrative only. Changes may be made in the details, especially in matters of shape, size, and arrangement of the parts within the principles of the inventions to the full extent indicated by the broad meaning of the terms of the attached claims. The description and drawings of the specific embodiments herein do not point out what an infringement of this patent would be, but rather provide an example of how to use and make the invention. Likewise, the abstract is neither intended to define the invention, which is measured by the claims, nor is it intended to be limiting as to the scope of the invention in any way. Rather, the limits of the invention and the bounds of the patent protection are measured by and defined in the following claims.

What is claimed is:

1. A pedestrian pushbutton assembly for activating a traffic control device, the pushbutton comprising:
   a housing having a sidewall and front wall, the front wall having a front surface and rear surface and defining a plunger recess;

a plunger mounted in the housing for axial movement in the plunger recess, the plunger having a front defining a pushbutton;

a switch in the housing configured to be actuated by inward pressure on the pushbutton;

a first resilient element configured to bias the plunger axially inwardly; and a second resilient member configured to bias the plunger axially outwardly;

wherein the outwardly biasing force exerted on the plunger by the second resilient member is about equal to the inwardly biasing force exerted on the plunger by the first resilient member whereby at rest the plunger maintains positional equilibrium.

2. The pushbutton assembly of claim 1 further comprising:

at least one bolt having a free end nonmovably fixed to the plunger, a head disposed behind the front wall of the housing, and an unthreaded shaft between the head and the free end, the shaft extending through a bore in the front wall of the housing and sized to allow the axial movement of the plunger relative to the housing; and wherein the first resilient element comprises an annular member around the shaft interposed between the head of the at least one bolt and the rear surface of the front wall of the housing.

3. The pushbutton assembly of claim 2 wherein the at least one bolt comprises a plurality of bolts and wherein the first resilient element comprises an annular member around the shaft of each of the plurality of bolts each annular member interposed between the head of the at least one bolt and the rear surface of the front wall of the housing.

4. The pushbutton assembly of claim 2 wherein the plunger includes a back with a nose extending inwardly, wherein the plunger recess includes a piezo recess, wherein the second resilient element comprises a foam disk in the piezo recess, wherein the switch comprises a piezo bender supported on the foam disk in the piezo recess and positioned to confront the nose on the back of the plunger so that pressure on the pushbutton will actuate the piezo bender.

5. The pushbutton assembly of claim 4 wherein the nose is formed of resilient material, and wherein the second resilient element further comprises the resilient nose.

6. The pushbutton assembly of claim 2 wherein the plunger recess includes a piezo recess, wherein the switch comprises a piezo bender in the piezo recess, wherein the plunger has a back with a nose extending inwardly from the back of the plunger to abut the piezo bender so that pressure on the pushbutton will actuate the piezo bender, wherein the nose is formed of resilient material, and wherein the second resilient element comprises the resilient nose.

7. The pushbutton assembly of claim 1 wherein the plunger includes a back with a nose extending inwardly, wherein the plunger recess includes a piezo recess, wherein the second resilient element comprises a foam disk in the piezo recess, wherein the switch comprises a piezo bender supported on the foam disk in the piezo recess and positioned to confront the nose on the back of the plunger so that pressure on the pushbutton will actuate the piezo bender.

8. The pushbutton assembly of claim 7 wherein the nose is formed of resilient material, and wherein the second resilient element further comprises the resilient nose.

9. The pushbutton assembly of claim 7 wherein the plunger recess includes a piezo recess, wherein the switch comprises a piezo bender in the piezo recess, wherein the plunger has a back with a nose extending inwardly from the back of the plunger to abut the piezo bender so that pressure on the pushbutton will actuate the piezo bender, wherein the nose is formed of resilient material, and wherein the second resilient element comprises the resilient nose.

10. The pushbutton assembly of claim 1 further comprising a light assembly configured to emit a light in response to pressure on the pushbutton.

11. The pushbutton assembly of claim 1 wherein the plunger recess includes a peripheral wall, wherein the plunger has a peripheral rim received within and adjacent to the peripheral wall, and wherein the pushbutton assembly further comprises an annular resilient member disposed between the peripheral rim of the plunger and the peripheral wall of the plunger recess to center the plunger.

12. The pushbutton assembly of claim 11 wherein one of the peripheral rim of the plunger and the peripheral wall of the plunger recess defines a circumferential groove for receiving the annular resilient member.

13. The pushbutton assembly of claim 11 wherein the peripheral rim of the plunger defines a circumferential groove for receiving the annular resilient member.

14. The pushbutton assembly of claim 1 further comprising a sound assembly configured to emit sound in response to actuation of the switch.

15. The pushbutton assembly of claim 14 wherein the sound assembly comprises a resonance chamber that is tuned based on the Helmholtz formula by sizing the chamber to achieve an optimum frequency.

16. The pushbutton assembly of claim 15 wherein the sound assembly is configured to produce a sound level that is greater than about 100 dB.

17. The pushbutton assembly of claim 14 wherein the sound assembly comprises a piezo sounder.

18. The pushbutton assembly of claim 17 wherein the piezo sounder comprises a circular plate, wherein the sound assembly comprises a sound housing having an open end, wherein the sound assembly further comprises a cup-shaped cover having an open end, the cup-shaped cover resiliently supported inside the open end of the sound housing, wherein the peripheral edge of the circular plate of the piezo sounder is circumferentially captured between the sound housing and the open end of the cup-shaped cover.

19. The pushbutton assembly of claim 18 wherein the sound assembly comprises a resonance chamber that is tuned based on the Helmholtz formula by sizing the chamber to achieve an optimum frequency.

20. The pushbutton assembly of claim 19 wherein the sound assembly is configured to produce a sound level that is greater than about 100 dB.

21. A pedestrian pushbutton for activating a traffic control device, the pushbutton comprising:

a housing having a sidewall and front wall, the front wall having a front surface and rear surface, wherein the front wall defines a plunger recess, wherein the plunger recess includes a peripheral wall;

a plunger mounted in the housing for axial movement in the plunger recess, the plunger having a front defining a pushbutton, wherein the plunger has a peripheral rim received within and adjacent to the peripheral wall of the plunger recess;

a switch in the housing configured to be actuated by inward pressure on the pushbutton; and an annular resilient member disposed between the peripheral rim of the plunger and the peripheral wall of the plunger recess to center the plunger.

22. The pushbutton assembly of claim 21 wherein one of the peripheral rim of the plunger and the peripheral wall of the plunger recess defines a circumferential groove for receiving the annular resilient member.

23. The pushbutton assembly of claim 22 wherein the peripheral rim of the plunger defines a circumferential groove for receiving the annular resilient member.

\* \* \* \* \*